(12) United States Patent
Boddikurapati et al.

(10) Patent No.: US 11,686,764 B2
(45) Date of Patent: Jun. 27, 2023

(54) INTEGRATED CIRCUIT MANUFACTURE AND OUTLIER DETECTION

(71) Applicant: Texas Instruments Incorporated, Dallas, TX (US)

(72) Inventors: Sirish Boddikurapati, Garland, TX (US); Amit Nahar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 254 days.

(21) Appl. No.: 17/001,442

(22) Filed: Aug. 24, 2020

(65) Prior Publication Data

US 2021/0063479 A1 Mar. 4, 2021

Related U.S. Application Data

(60) Provisional application No. 62/891,715, filed on Aug. 26, 2019.

(51) Int. Cl.
*G01R 31/28* (2006.01)
*G06N 3/02* (2006.01)
*G06F 30/333* (2020.01)

(52) U.S. Cl.
CPC ....... *G01R 31/2894* (2013.01); *G01R 31/287* (2013.01); *G06F 30/333* (2020.01); *G06N 3/02* (2013.01)

(58) Field of Classification Search
CPC .............. G01R 31/2894; G01R 31/287; G01R 31/31718; G06F 30/333; G06N 3/02; G06N 3/0454
See application file for complete search history.

(56) References Cited

U.S. PATENT DOCUMENTS

| | | | |
|---|---|---|---|
| 7,129,735 B2 | 10/2006 | Subramaniam et al. | |
| 7,494,829 B2 | 2/2009 | Subramaniam et al. | |
| 8,126,681 B2 | 2/2012 | Nahar et al. | |
| 8,392,772 B2 * | 3/2013 | Burggraf, III | G11C 29/00 714/724 |
| 2008/0262793 A1 * | 10/2008 | Subramaniam | G01R 31/2894 702/179 |
| 2011/0071782 A1 * | 3/2011 | Nahar | G01R 31/31718 702/179 |
| 2011/0178967 A1 * | 7/2011 | Delp | G06F 11/2263 706/20 |
| 2013/0088253 A1 * | 4/2013 | Nahar | G01R 31/2834 324/762.01 |
| 2016/0026915 A1 * | 1/2016 | Delp | G05B 23/0278 706/20 |

* cited by examiner

*Primary Examiner* — Alvaro E Fortich
(74) *Attorney, Agent, or Firm* — Ronald O. Neerings; Frank D. Cimino

(57) ABSTRACT

An integrated circuit method processes parametric data for each integrated circuit die in a plurality of integrated circuit die to determine an expected data pattern, screens integrated circuit die by comparing a data pattern corresponding to a plurality of parametric data for the integrated circuit die to an expected data pattern and, responsive to the comparing, determining whether a difference between the data pattern corresponding to a plurality of parametric data for the predetermined integrated circuit die and the expected data pattern is beyond a tolerance.

23 Claims, 5 Drawing Sheets

INTEGRATED CIRCUIT MANUFACTURE AND OUTLIER DETECTION

CROSS-REFERENCE TO RELATED APPLICATION

This application claims priority to, the benefit of the filing date of, and hereby incorporates herein by reference: U.S. Provisional Patent Application No. 62/891,715, entitled "SEMICONDUCTOR OUTLIER DETECTION USING MULTI-VARIATE DEEP-LEARNING ENCODING AND RECONSTRUCTION METHODOLOGY BASED ON NEURAL NETWORKS," filed Aug. 26, 2019.

BACKGROUND

The example embodiments relate to manufacture and outlier detection of an integrated circuit (IC) die.

Integrated circuit devices are often fabricated in partitioned spaces along a semiconductor wafer surface, with layers formed currently across all spaces and the portioned spaces later cut apart from one another, or "singulated," to provide individual pieces, referred to as die. Either before and/or after singulation, each individual die is subjected to a series of tests to determine if the respective die functions properly. These tests are sometimes repeated at several points in the manufacturing process. For example, testing can occur before or after singulating the die, including after die packaging (in which case the packaged die is sometimes referred to as a chip), where such actions can impose thermal and mechanical stresses that can induce die failure, for the die either before or after die packaging. Each die that fails testing is identified so that the failed die is not thereafter sold to a customer, and instead it may be discarded or otherwise studied to potentially determine the cause for its failure. Meanwhile, die that pass testing are released (mostly in packaged form) for sale to customers, which for example may be original equipment manufacturers (OEMs) that often implement the die into larger systems or devices. The measure or ratio that relates test-passing die to test-failing die is commonly referred to as yield, and testing and manufacturing improvement and refinement seek to improve yield.

While the above-described testing has historically provided a generally increasing measure of success, sometimes a test-passing die may later fail to operate properly. Such post-testing failure can occur when an OEM is further testing the die, either as a standalone device or once the die (again, typically post-packaging) is included into a larger system. Clearly such failures are undesirable, both to the OEM and the die manufacturer. Moreover, often the OEM will return the failed die to the die manufacturer. The die manufacturer, in turn, often incurs significant research costs in evaluating the cause of the failure in addition to determining why the earlier testing failed to identify the die as unacceptable for commercial sale and long term longevity.

Accordingly, example embodiments are provided in this document that may improve on certain of the above concepts, as further detailed below.

SUMMARY

An integrated circuit method, comprising: (i) processing a plurality of parametric data for each integrated circuit die in a plurality of integrated circuit die to determine an expected data pattern corresponding to the plurality of integrated circuit die; (ii) screening a predetermined integrated circuit die by comparing a data pattern corresponding to a plurality of parametric data for the predetermined integrated circuit die to the expected data pattern; and (iii) responsive to the comparing determining that a difference between the data pattern corresponding to a plurality of parametric data for the predetermined integrated circuit die and the expected data pattern is beyond a tolerance, identifying the integrated circuit die as an outlier.

Other embodiments and aspects are also disclosed and claimed.

DETAILED DESCRIPTION

IC manufacture and outlier detection includes testing, and design changes in response to test determinations, as critically practical applications for semiconductor device manufacturers and their consumers. IC testing can reveal IC design aspects that require change, alteration, or adjustment, to ultimately improve the design in future iterations of the device. For example, an improved design is less vulnerable to manufacturing and/or operational error. As another example, the IC designer/manufacturer typically has certain yield requirements, guided by market considerations and user needs/expectations. Accordingly, tests on either a sample of ICs, or all ICs, are performed using various techniques and/or apparatus. Such testing predicts post-manufacture behavior of the IC. Without such testing, an improperly tested circuit can initially, periodically, or after long term usage, fail to perform, in which case the IC user(s), or a user of a system that relies on the IC, may be subject to the consequences of a performance failure. Example embodiments are directed to the practical application of testing from which IC design and manufacture are also improved.

Figure 1:
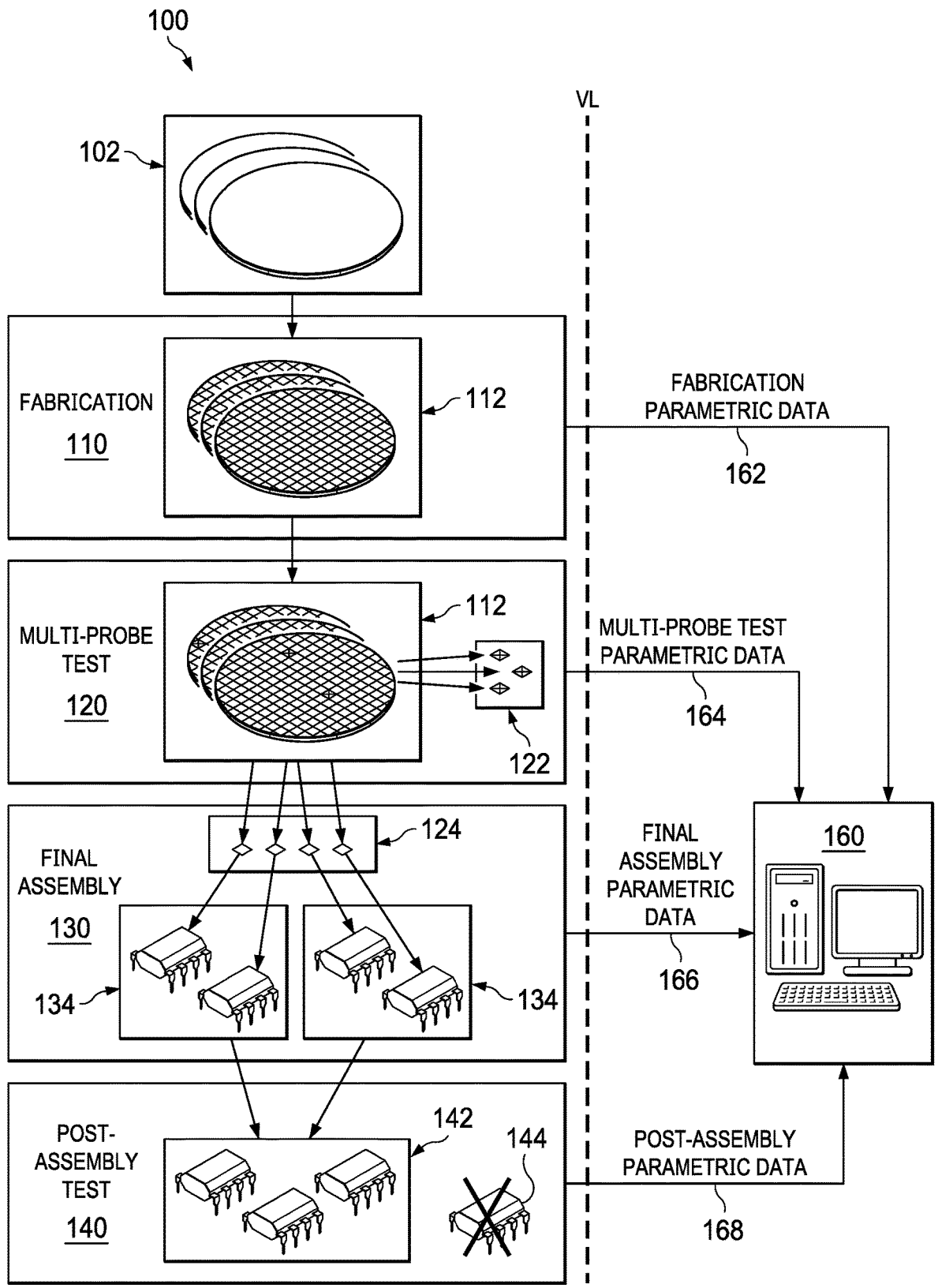
FIG. 1 illustrates a flow chart of a method 100 and its related steps, data, and operational hardware.

FIG. 1 illustrates a flow chart of a method 100 and its related steps, data, and operational hardware. For illustration and explanation, a dashed vertical line VL is shown, and to the left of vertical line VL are four IC fabrication and testing method steps (and respective related devices): (i) fabrication 110; (ii) multi-probe test 120; (iii) final assembly 130; and (iv) post-assembly test 140. To right left of vertical line VL is a data processing and storage system 160, for processing parametric data resulting from the IC fabrication and testing method steps, and which also may facilitate, or apply to a separate system that facilities, the device fabrication. The following first further details the data processing and storage system 160, then second returns to a description of the FIG. 1 steps and resulting parametric data.

Figure 2A:
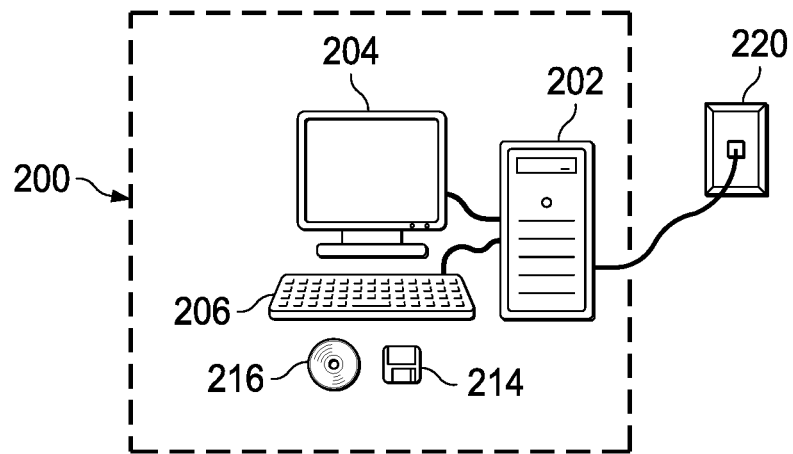
FIGS. 2A and 2B illustrate an example system configuration 200 suitable for implementing the data processing and storage system 160 of FIG. 1.
Figure 2B:
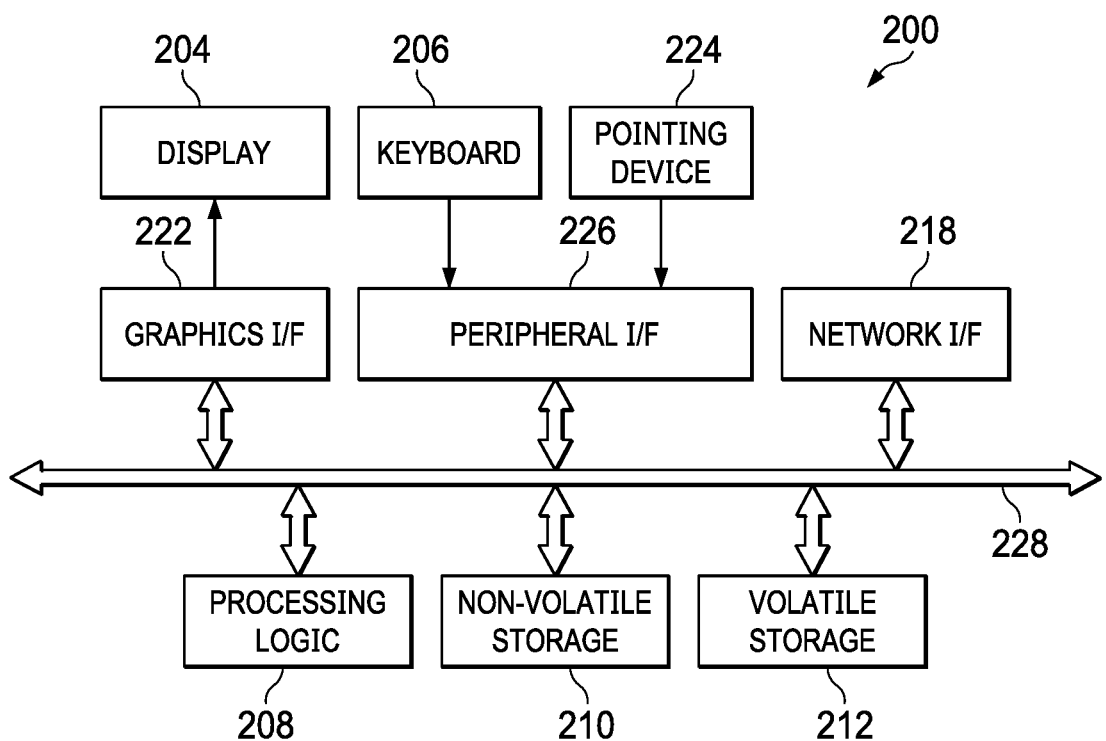

FIGS. 2A and 2B illustrate an example system configuration 200 suitable for implementing the data processing and storage system 160 of FIG. 1. Shown in FIG. 2A, the system configuration 200 includes a chassis 202, a display 204, and an input device (e.g., a keyboard) 206. Shown in FIG. 2B, the system configuration 200 includes processing logic 208 (e.g., a microprocessor), non-volatile storage 210, and volatile storage 212. The non-volatile storage 210 includes a computer-readable medium such as a flash random access memory (flash RAM), a read-only memory (ROM), a hard disk drive, a floppy disk (e.g., FIG. 2A, floppy 214), a compact disk read-only memory (e.g., FIG. 2A, CD-ROM 216), as well as combinations of some and/or all such media. The volatile storage 212 includes a computer readable medium, such as random access memory (RAM).

The computer readable media of both the non-volatile storage 210 and volatile storage 212 includes, for example, software that is executed by the processing logic 208 and that provides the system configuration 200 (and likewise, processing and storage system 160) with at least some of the functionality described herein. The system configuration 200 also includes a network interface (Network I/F) 218 that enables the system configuration 200 to transmit information to, and receive information from, a local area network (LAN) and/or a wide area network (WAN), represented in the example of FIG. 2A by an Ethernet jack 220. A graphics interface (Graphics I/F) 222 couples to the display 204. A user interacts with the system via an input device such as keyboard 206 and/or pointing device (Pointing Dev) 224 (e.g., a mouse), which couples to a peripheral interface (Peripheral I/F) 226. The display 204, keyboard 206 and pointing device 224 together may operate as a user interface.

The system configuration 200 may be a bus-based computer, with a bus 228 interconnecting the various elements shown in FIG. 2B. The peripheral interface 226 accepts signals from the keyboard 206 and other input devices such as pointing device 224, and transforms the signals into a form suitable for communication on bus 228. The graphics interface 222 may include a video card or other suitable display interface that accepts information from the bus 228 and transforms it into a form suitable for the display 204.

The processing logic 208 gathers information from other system elements, including input data from the peripheral interface 226, and program instructions and other data from a form of programming nontransitory medium, such as the non-volatile storage 210 or volatile storage 212, or from other systems (e.g., a server used to store and distribute copies of executable code) coupled to a local area network or a wide area network via the network interface 218. The processing logic 208 executes the program instructions and processes the data accordingly. The program instructions may further configure the processing logic 208 to send data to other system elements, such as information presented to the user via the graphics interface 222 and the display 204. The network interface 218 enables the processing logic 208 to communicate with other systems via a network. The volatile storage 212 may serve as a low-latency temporary store of information for the processing logic 208, and the non-volatile storage 210 may serve as a long-term (but higher latency) store of information.

The processing logic 208, and hence the system configuration 200 as a whole, operates in accordance with one or more programs stored in the non-volatile storage 210 or received via the network interface 218. The processing logic 208 may copy portions of the programs into the volatile storage 212 for faster access, and may switch between programs or carry out additional programs in response to user actuation of the input devices. The additional programs may be retrieved or received from other locations via the network interface 218. One or more of these programs executes on the system configuration 200, causing the configuration to perform at least some of the functions of data processing and storage system 160 as described herein. Lastly, the system configuration 200 alternatively may be a distributed data processing and storage system. Many other data processing and storage system configurations will become apparent to those skilled in the art, and all such configurations are within the present contemplated scope. Further, the processing logic may be implemented in hardware, software, or combinations of hardware and software.

Returning to FIG. 1, starting at the fabrication 110, a sample group 112 of what ultimately forms packaged semiconductor die is manufactured from respective portions of wafers 102. Fabrication parametric data 162 for sample group 112 may be saved in the data processing and storage system 160. Data referred to herein as parametric, whether part of parametric data 162 or other references to parametric of other data described below, is data that describes or otherwise is associated with a characteristic that comprises a measured or observed feature of an IC die, or of test structure outside the boundaries of the die (e.g., a scribe line test structure), and/or of any operation performed on a semiconductor die or wafer, and/or of any machine or process used to perform an operation on a die or wafer. Such parametric data is collected at any of several points during the manufacture of the die and packaging of it. The fabrication parametric data 162, for example, may include any suitable parametric data such as process type, number of layers, number of masks, target threshold voltages, doping concentrations, temperatures and humidity during each processing step, via or contact resistance measurements, and visual inspection results.

Following the fabrication 110, the sample group 112 is subjected to the multi-probe test 120, in which the individual die on each of the wafers 102 of the sample group 112 are tested. In the illustrated example, the multi-probe test 120 identifies those die that meet or exceed (pass) the required functional and electrical parameters defined by the design engineers. The multi-probe test 120 provides both -probe test parametric data 164 which is coupled (and likely saved) to the data processing and storage system 160. The multi-probe test parametric data 164 may include die position within a wafer, wafer identification, type of test equipment used, test program used, time and date of testing, and the number of die that passed the multi-probe test). The multi-probe test 120 is performed on one die at a time or on plural die in parallel (e.g., two die at a time). In parallel testing, the multi-probe test parametric data 164 may include the identity of the particular probe used to test a die (allowing for later correction of probe-specific errors or adjustment for probe-specific biases).

After completing the multi-probe test 120, the die within each wafer are singulated (separated from each other) into individual die. Likely, some sample die will not pass the multi-probe test 120, and those are designated as failures 122 and are separated from the sample group 112. The failures 122 may be scrapped or may undergo additional testing or analysis. The remaining (passing) sample die 124 are sent to final assembly 130, which typically involves bonding each die to some electrical structure for signal input/output and also packaging or encapsulation of the die (or plural die), thereby resulting in a number of packaged sample die 134. Final assembly parametric data 166 may be collected in connection with the final assembly 130 step(s), and that data is saved within the data processing and storage system 160. Final assembly parametric data 166 may include packaging type, assembly equipment used, bonding method used, and time and date of assembly.

After final assembly 130 is complete, the packaged sample die 134 proceed to post-assembly test 140. The post-assembly test 140 may include tests similar to those executed during the multi-probe test 120, and also is used to identify those packaged sample die 134 that function within the functional and electrical parameters defined by the design engineers. Again, data, here as post-assembly parametric data 168, corresponding to the data type from the post-assembly test 140, is generated by and/or communicated to the data processing and storage system 160. The post-assembly parametric data 167 may include data similar to the multi-probe test parametric data 164, here including the number of packaged sample die 134 that pass (thereby constituting a post-assembly test passing packages 142) and the number that fail (thereby constituting a post-assembly test failing packages 144) the post-assembly test 140, as well as the specific type of testing passed and/or failed.

After completing the post-assembly testing 140, the post-assembly test failing packages 144 are separated from the post-assembly test passing packages 142. The post-assembly test failing packages 144 may be scrapped or may undergo additional testing or analysis. The post-assembly test passing packages 142 may undergo additional processing with corresponding testing (e.g., burn-in), although such additional steps are not shown to simplify the illustration and description. In the event of such additional steps, data corresponding thereto also may be communicated to, stored in, and/or processed by, the data processing and storage system 160.

Figure 3:
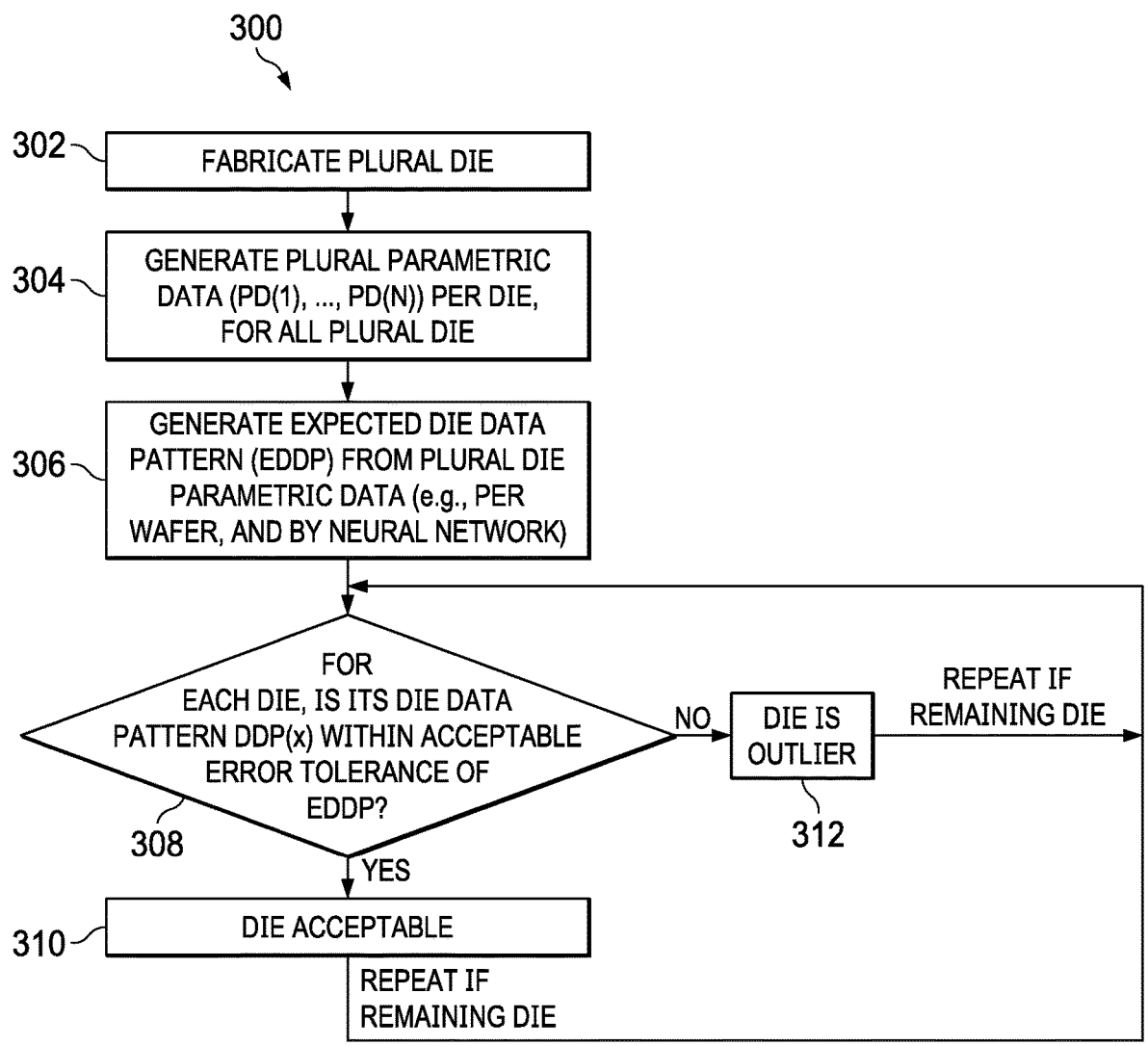
FIG. 3 is a flow chart showing steps for an exemplary method 300 of manufacture and outlier detection of an IC die.

FIG. 3 is a flow chart showing additional steps for an exemplary integrated circuit method 300, for manufacture and outlier detection of integrated circuit die.

Method 300 commences with a step 302 that fabricates plural semiconductor die, using materials and processing steps either known or knowable to one skilled in the art, insofar as the physical and electrical structure and connectivity are involved. For example, the plural semiconductor die may be formed on/in a semiconductor wafer, which may be of varying different diameters and include a varying number of die, separated from one another by respective boundaries that may be scribed between the die. Typically each die is concurrently formed by like processing of the entire wafer, so that respective structures are formed within respective boundaries of each die, including physical, photolithographic, and chemical processes to the respective structures and connections of each die. Next, method 300 continues from step 302 to step 304.

Step 304 generates plural parametric data for each die manufactured, or while being manufactured, of step 302. Generally, therefore, step 304 may be embodied by any one or more of the above-described FIG. 1 parametric data 162, 164, 166, and 168 (or still others). Accordingly, step 304, as well as steps following it, may in part or whole be accomplished by data processing and storage system 160 of FIG. 1. In step 304 and for reference, for a given die, its plural parametric data will be identified as PD(1), . . . , PD(N), where N is two or more. For a relatively simple example, therefore, suppose that each parametric data PD(x) is a leakage measurement of the die, under a respective set of conditions, and suppose N=3. In this case, PD(1) provides a first leakage measurement under a first set of conditions, PD(2) provides a second leakage measurement under a second set of conditions, and PD(3) provides a third leakage measurement under a third set of conditions. In that example, then step 304 generates all three leakage measurements, for each of the plural die (e.g., on a wafer). Next, method 300 continues from step 304 to step 306.

Figure 4:
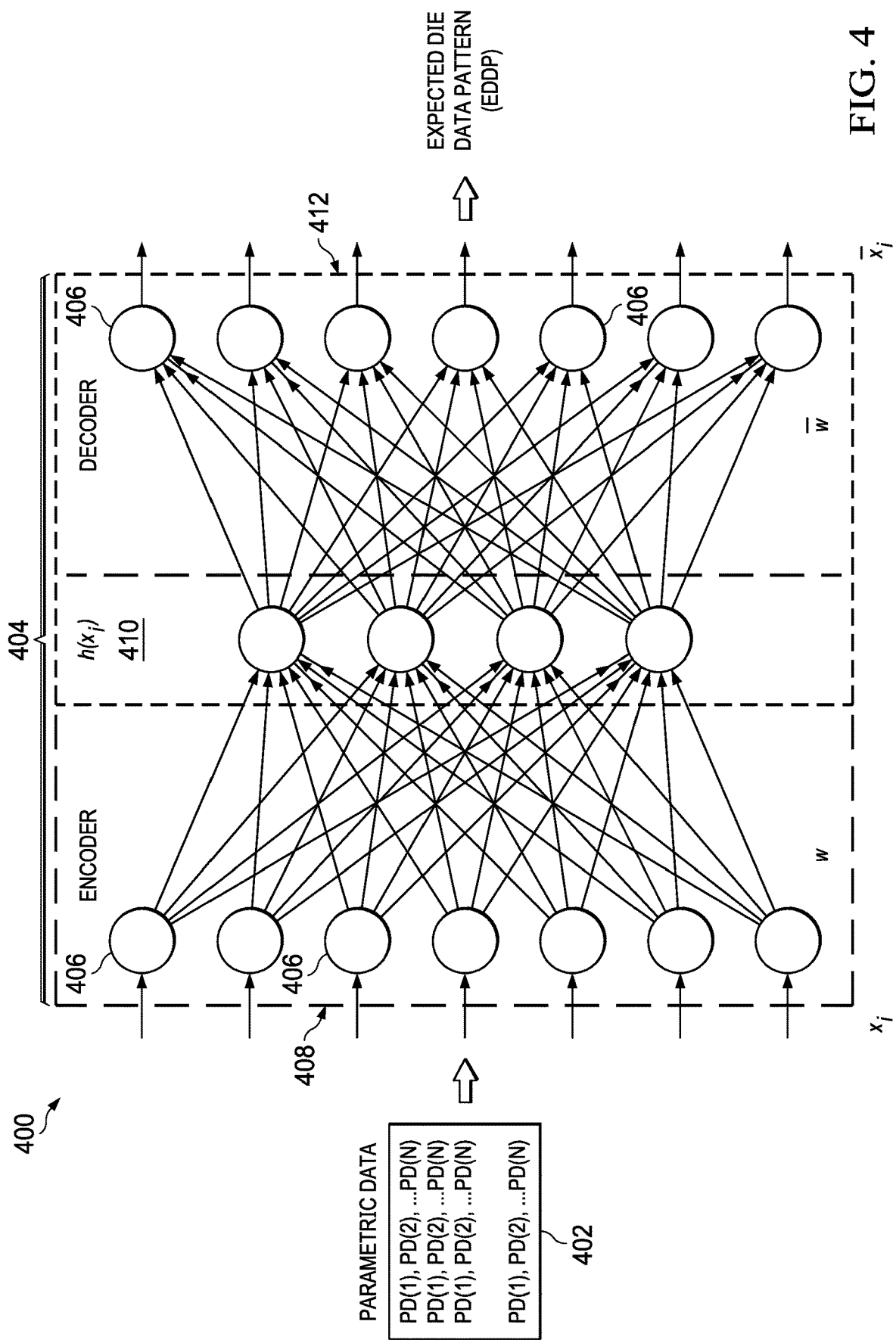
FIG. 4 depicts a neural network system 400.

Step 306 generates, from some or all of the step 304 parametric data, an expected die data pattern (EDDP), as now described. In an example embodiment, step 306 inputs some or all of the step 304 parametric data into an encoder, which in one example embodiment is a neural network. A neural network generally includes a large number of interconnected processing nodes that receive inputs and feed forward analyses to other nodes. The nodal network thusly characterizes patterns that are learned from the input data, either from the data itself or in combination with earlier training, weighting, threshold cutoffs, and other bases in the neural network art. Neural networks are in some sense akin to the human mind, in which exposure over time to inputs then provide conclusions and also permit refinement of those conclusions and application to similar inputs later, so as to reach the same or similar conclusions. For example, as a child is learning attributes about live creatures, the child may receive certain attributes (e.g., number of legs, sounds, shapes, size, behavior, etc.) from which the child concludes that a particularly perceived (via inputs) creature is of a particular type (the conclusion). Later as the child ages and incurs the same or similar data, the child draws comparable and more learning based and refined conclusions. In the context of step 306, FIG. 4 depicts a neural network system 400. In neural network system 400, the step 304 parametric data is illustrated in a matrix 402, where each row of the matrix 402 includes the parametric data, of a respective die, from step 304. Further, the collection of all rows of the matrix 402 includes all step 304 parametric data, corresponding to all plural die. The matrix 402 is input to a neural network 404, which by way of example may be implemented in the data processing and storage system 160 of FIG. 1 and includes nodes 406 (only some numbered in FIG. 4 for simplicity) that cumulatively function as an encoder 408. The encoder 408 processes the parametric data from the matrix 402, and through learning the neural network 404 develops a transfer function 410 that provides data fed forward toward providing a conclusion, based on the input and the transfer function 410. Accordingly, the transfer function 410 feeds forward information to provide a decoder 412 that can further adapt and output the conclusion. In the context of FIG. 4, the neural network 404 conclusion is the EDDP, further described below.

Figure 5:
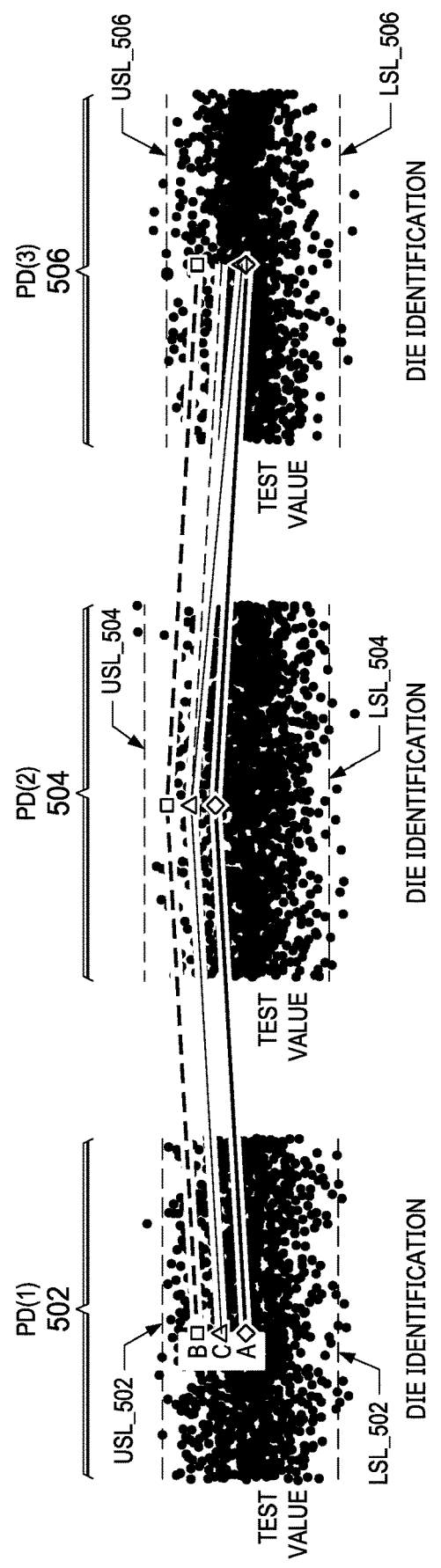
FIG. 5 illustrates various die parametric data as processed by the neural network system 400 of FIG. 4.

FIG. 5 illustrates various die parametric data, as further context for FIGS. 3 and 4. Specifically, FIG. 5 illustrates a first parametric data distribution plot 502 to the left of the drawing, where each dot is a respective parametric data PD(1) for a die, so the dots collectively in the plot 502 represent PD(1) for all die from step 304. The horizontal plot axis identifies each die (such as by device number or identification), and the vertical plot axis identifies a test value associated with each die. Recalling an earlier example in which all parametric data were leakage measurements, then in FIG. 5, each dot in the plot 502 indicates a first leakage measurement for a respective die in the plural die on a wafer. In the plot 502, a typical distribution includes a larger number of the dots (data points) located nearer the middle of the range of the plot's vertical axis. Also in this regard, a die typically has an associated lower specification limit (LSL) and an upper specification limit (USL) for the die, shown as dashed lines LSL_502 and USL_502 in plot 502. Similarly, FIG. 5 illustrates a second parametric data distribution plot 504 toward the middle of the drawing, with all dots corresponding to respective parametric data PD(2) for all die from step 304 (e.g., a second leakage measurement from each respective die in the plural die on a wafer). Note that plot 504 also has a respective LSL_504 and USL_504, which may or may not have the same values as those of a different plot (such as LSL_502 and USL_502). And lastly, FIG. 5 illustrates a third parametric data distribution plot 506 to the right of the drawing, with all dots collectively corresponding to parametric data PD(3) for all die from step 304 (e.g., a third leakage measurement from each respective die in the plural die on a wafer). Plot 506 also includes respective LSL_506 and USL_506. Combining the contexts of FIG. 5 and FIG. 4, the total of all parametric data of the FIG. 5 distribution plots 502, 504, and 506 provides the matrix 402.

Recall that the matrix 402 is input to the neural network 404, and for each row input from the matrix 402 (corresponding to a same die), the neural network 404 can determine a pattern between the parametric data for that die. For example in FIG. 5, plot B illustrates a determined respective pattern connecting the three parametric data (PD(1), PD(2), PD(3)) corresponding to one particular die. Similarly, plot C is another example pattern for a different die. Moreover, inasmuch as the neural network 404 receives data input, and from it develops pattern recognition and provides a corresponding prediction, then across some or all input parametric data corresponding to multiple die, the neural network 404 develops and predicts a conclusion of an overall pattern between the different input data values, that overall pattern indicative of multiple parametric data for multiple different die. This concluded pattern constitutes the expected die data pattern, EDDP, across all die for which data is input to the network. Accordingly, the EDDP is a neural-network concluded pattern of what would be expected between distributions for each respective parametric data PD(1), . . . , PD(N), across what is likely many different die. For example, the EDDP may be generated from a range of 100,000 to 500,000 die. Hence, that EDDP is shown as the output of neural network system 400 in FIG. 4, and as an example, in FIG. 5, plot A is intended to graphically illustrate such an EDDP, corresponding to a relationship among the three parametric data (PD(1), PD(2), PD(3)) for a plural number of die. Note that the number of die data to develop the EDDP can be from all data of step 304, or from a subset, or the EDDP can be initially formed and refined as more data is generated and input. In this regard, some step 304 data can be disregarded in developing the EDDP, either by eliminating it from the input matrix 402, or by inputting it to the neural network 404 and then eliminating any of its effect on the conclusion, by operation of the nodes 406. In one instance, data eliminated in this manner can be that which is outside the range between the lower specification limit LSL and the upper specification limit USL for the die. In that instance, as step 304 generates parameter data, note that some of that data may be outside the boundaries between the LSL and USL, and such boundary-exceeding data may be immediately indicated as undesirable for including in pattern recognition, due to its exceeding the LSL/USL data range. Accordingly, the undesirable data can be excluded in the development of the EDDP, so as to develop the EDDP based only on data that arises from between the specifications established by the LSL and USL, thereby keeping usable data as that which would be within an acceptable data distribution for a non-outlier die. In all events, after the EDDP is generated, method 300 continues from step 306 to step 308.

Step 308 is a conditional check that screens dies into either acceptable devices (see step 310) or outlier devices (see step 312). Specifically, step 308 compares the actual die data pattern DDP(x) for each individual die in a set of plural die (e.g., on a wafer, or those not already ruled as outliers on the wafer), to the EDDP, where the difference between the DDP(x) and the EDDP is evaluated to determine if it is within an acceptable tolerance. The acceptable differential tolerance can be based on various measures, such as whether the mean square error of the step 308 difference is below an established threshold. By way of example and returning again to FIG. 5, note that plot B of a first die has a generally higher magnitude than the EDDP plot A, but that the slope difference between the plots is relatively constant, that is, both plots have very similar slopes. In this example, it may be assumed that a relative stable slope difference along the respective plots represents that the pattern of plot B is acceptably similar to the expected EDDP of plot A, in which case the die corresponding go plot B is within tolerance, and as such step 308 advances to step 310 and indicates the die is acceptable. As an acceptable die, the die may be directed toward later shipment/sale to a customer, and later appropriately shipped/sold. In contrast and also in FIG. 5, note that plot C of a second die also has a generally higher magnitude than the EDDP plot A, but that the slope difference between the plots is not relatively constant. Particularly, while the slope of plot C can be seen to be the same between PD(1) and PD(2) as compared to the EDDP plot A also between PD(1) and PD(2), the slope of plot C can be seen to be steeper between PD(2) and PD(3) as compared to the slope of the EDDP plot A between PD(2) and PD(3), which is illustrated in part in that plot C also includes a dashed portion showing the slope it would track if it were the same as the slope of plot A. In this example, it may be assumed that the amount of slope difference along the respective plots, between PD(2) and PD(3), represents that the pattern of plot C is not acceptably similar to the expected EDDP of plot A; in other words, the die corresponding to plot C is not within a differential slope tolerance of the expected pattern, and responsive to that beyond tolerance determination, step 308 advances to step 312 and indicates the die is an outlier, that is, unacceptable for release for sale or later use as integrated into some other device. Plots B and C are only two examples of the numerous die represented by the distribution plots 502, 504, and 506 in FIG. 5, and notably in FIG. 3, step 308 repeats for each die in the plural die being evaluated, as shown at the bottom of the figure in which each of step 310 and 310 returns to step 308 to repeat if data for remaining die have not yet been checked per the step 308 condition.

From the preceding, one skilled in the art should appreciate that method 300 includes fabricating, testing, and screening integrated circuit die, either before each die is packaged and/or after packaging. The results provide numerous advantages. For example in FIG. 5, each data parameter distribution (for DP(1), DP(2), and DP(3)) graphically depicts a number of data points per distribution plot, and the respective data for both plots B and C are generally in or near the center of each distribution. Accordingly, were the data for the die corresponding to each of plots B and C considered one data point at a time, then each data could be found to be satisfactory due to its relatively central location among a distribution of a same type of measurement. In other words, under singular consideration of a parametric data (e.g., a first, second, or third leakage measurement), the die may pass testing and be released to a customer. In contrast, in the example embodiment, the pattern relating plural data points for a single die is compared to a predicted (e.g., by neural network processing) pattern derived from multiple die, in which case the slope deviation corresponding to plot B is relatively constant compared to the predicted pattern, resulting in that die being acceptable for release, while the slope deviation corresponding to plot C is less consistent compared to the expected pattern, resulting in that die being unacceptable for release. Accordingly, devices potentially indicated for release under one type of approach are instead not released. Indeed as another benefit, note that while the die plot C magnitude is overall closer to the EDDP plot A than is the die plot B magnitude, the present teachings permit identification of the die corresponding to plot C be marked as an outlier, while the die corresponding to plot B is marked as an acceptable device. Further, modeling, and anecdotal evaluation of the example embodiments have indicated an improvement in both yield and a reduction of customer returns, when fabricating devices to include screening of them (and their respective parametric data) according to the present teachings of this document. Moreover, the above embodiments are provides as examples, and various modifications are contemplated or may be made within the inventive scope. For example, while leakage current has been used as an example for a parametric data measure pertaining to the operation of the integrated circuit die, other operational attributes of current, voltage, frequency, or other non-operation or even non-electrical attributes may be considered and included (e.g., process, spatial location on wafer, environmental factor(s), lot, date, geography, etc.). As another example, while FIG. 5 and the preceding discussion uses three parametric data measures, the plural parametric data could be as low as two or greater than three. Accordingly, additional modifications are possible in the described embodiments, and other embodiments are possible, within the scope of the following claims.

What is claimed is:

1. An integrated circuit method, comprising:
   processing a plurality of parametric data for each integrated circuit die in a plurality of integrated circuit die to determine an expected data pattern corresponding to the plurality of integrated circuit die;
   screening a predetermined integrated circuit die by comparing a data pattern corresponding to a plurality of parametric data for the predetermined integrated circuit die to the expected data pattern; and
   responsive to the comparing determining that a difference between the data pattern corresponding to the plurality of parametric data for the predetermined integrated circuit die and the expected data pattern is beyond a tolerance, identifying the beyond a tolerance predetermined integrated circuit die as an outlier.

2. The integrated circuit method of claim 1 and further comprising fabricating each integrated circuit die in the plurality of integrated circuit die.

3. The integrated circuit method of claim 2 and further comprising measuring the plurality of parametric data as one or more steps either during the fabricating or packaging of each integrated circuit die.

4. The integrated circuit method of claim 1 wherein the processing step comprises inputting the plurality of parametric data for each integrated circuit die in the plurality of integrated circuit die into a neural network.

5. The integrated circuit method of claim 4 wherein the neural network provides the expected data pattern.

6. The integrated circuit method of claim 1 wherein the plurality of integrated circuit die are formed in a single wafer.

7. The integrated circuit method of claim 1 wherein the processing step processes a plurality of integrated circuit die for all integrated circuit die formed in a single wafer.

8. The integrated circuit method of claim 1 wherein the plurality of parametric data comprises voltage data.

9. The integrated circuit method of claim 1 wherein the plurality of parametric data comprises current data.

10. The integrated circuit method of claim 1 wherein the plurality of parametric data comprises frequency data.

11. The integrated circuit method of claim 1 wherein the plurality of parametric data comprises non-electrical data.

12. The integrated circuit method of claim 1 wherein the plurality of parametric data comprises data relating the integrated circuit die to a position on a wafer.

13. The integrated circuit method of claim 1 and further comprising, responsive to the comparing determining that the difference between the data pattern corresponding to a plurality of parametric data for the predetermined integrated circuit die and the expected data pattern is within a tolerance, identifying the within a tolerance predetermined integrated circuit die for shipment to a customer.

14. An integrated circuit method, comprising:
    processing a plurality of parametric data for each integrated circuit die in a plurality of integrated circuit die to determine an expected data pattern corresponding to the plurality of integrated circuit die;
    screening a predetermined integrated circuit die by comparing a data pattern corresponding to a plurality of parametric data for the predetermined integrated circuit die to the expected data pattern, wherein the comparing compares a slope of the data pattern corresponding to the plurality of parametric data for the predetermined integrated circuit die to a slope of the expected data pattern; and
    responsive to the comparing determining that a difference between the data pattern corresponding to the plurality of parametric data for the predetermined integrated circuit die and the expected data pattern is beyond a tolerance, identifying the beyond a tolerance predetermined integrated circuit die as an outlier, wherein the responsive step comprises determining whether a difference between the slope of the data pattern corresponding to the plurality of parametric data for the predetermined integrated circuit die and the slope of the expected data pattern is beyond a tolerance.

15. A nontransitory computer-readable program storage medium having stored thereon program instructions that when executed by processing logic have the processing logic capable of:
    processing a plurality of parametric data for each integrated circuit die in a plurality of integrated circuit die to determine an expected data pattern corresponding to the plurality of integrated circuit die;
    screening a predetermined integrated circuit die by comparing a data pattern corresponding to a plurality of parametric data for the predetermined integrated circuit die to the expected data pattern; and
    responsive to the comparing determining that a difference between the data pattern corresponding to the plurality of parametric data for the predetermined integrated circuit die and the expected data pattern is beyond a tolerance, identifying the beyond a tolerance predetermined integrated circuit die as an outlier.

16. The nontransitory computer-readable program storage of claim 15 having stored thereon program instructions that when executed by processing logic have the processing logic further capable of measuring the plurality of parametric data as one or more steps either during the fabricating or packaging of each integrated circuit die.

17. The nontransitory computer-readable program storage of claim 15 wherein the processing step comprises inputting the plurality of parametric data for each integrated circuit die in the plurality of integrated circuit die into a neural network.

18. The nontransitory computer-readable program storage of claim 17 wherein the neural network provides the expected data pattern.

19. A nontransitory computer-readable program storage medium having stored thereon program instructions that when executed by processing logic have the processing logic capable of:
processing a plurality of parametric data for each integrated circuit die in a plurality of integrated circuit die to determine an expected data pattern corresponding to the plurality of integrated circuit die;
screening a predetermined integrated circuit die by comparing a data pattern corresponding to a plurality of parametric data for the predetermined integrated circuit die to the expected data pattern, wherein the comparing compares a slope of the data pattern corresponding to the plurality of parametric data for the predetermined integrated circuit die to a slope of the expected data pattern; and
responsive to the comparing determining that a difference between the data pattern corresponding to the plurality of parametric data for the predetermined integrated circuit die and the expected data pattern is beyond a tolerance, identifying the beyond a tolerance predetermined integrated circuit die as an outlier, wherein the responsive step comprises determining whether a difference between the slope of the data pattern corresponding to the plurality of parametric data for the predetermined integrated circuit die and the slope of the expected data pattern is beyond a tolerance.

20. A method of producing integrated circuits, comprising:
fabricating a plurality of integrated circuit die;
packaging each integrated circuit in the plurality of integrated circuit die;
measuring a plurality of parametric data as one or more steps either during the fabricating or packaging of each integrated circuit die;
processing, in a neural network, the plurality of parametric data for each integrated circuit die to determine an expected data pattern corresponding to the plurality of integrated circuit die;
screening each integrated circuit die by comparing a data pattern corresponding to the plurality of parametric data for each integrated circuit die to the expected data pattern; and
responsive to the comparing determining that a difference between the data pattern corresponding to a plurality of parametric data for a predetermined integrated circuit die and the expected data pattern is beyond a tolerance, identifying the beyond a tolerance integrated circuit die as an outlier.

21. The method of claim 20 and further comprising, responsive to the comparing determining that the difference between the data pattern corresponding to a plurality of parametric data for the predetermined integrated circuit die and the expected data pattern is within a tolerance, identifying the within a tolerance predetermined integrated circuit die for shipment to a customer.

22. The method of claim 20 wherein the plurality of parametric data comprises voltage data, current data, and frequency data.

23. A method of producing integrated circuits, comprising:
fabricating a plurality of integrated circuit die;
packaging each integrated circuit in the plurality of integrated circuit die;
measuring a plurality of parametric data as one or more steps either during the fabricating or packaging of each integrated circuit die;
processing, in a neural network, the plurality of parametric data for each integrated circuit die to determine an expected data pattern corresponding to the plurality of integrated circuit die;
screening each integrated circuit die by comparing a data pattern corresponding to the plurality of parametric data for each integrated circuit die to the expected data pattern, wherein the comparing compares a slope of the data pattern corresponding to the plurality of parametric data for each integrated circuit die to a slope of the expected data pattern; and
responsive to the comparing determining that a difference between the data pattern corresponding to a plurality of parametric data for a predetermined integrated circuit die and the expected data pattern is beyond a tolerance, identifying the beyond a tolerance integrated circuit die as an outlier, wherein the responsive step comprises determining whether a difference between the slope of the data pattern corresponding to the plurality of parametric data for each integrated circuit die and the slope of the expected data pattern is beyond a tolerance.

* * * * *